(12) United States Patent
Kim et al.

(10) Patent No.: US 7,543,210 B2
(45) Date of Patent: Jun. 2, 2009

(54) SEMICONDUCTOR DEVICE AND TEST SYSTEM THEREOF

(75) Inventors: Joung-Yeal Kim, Yongin-si (KR); Ho-Young Song, Hwaseong-si (KR); Sung-Hoon Kim, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 367 days.

(21) Appl. No.: 11/499,661

(22) Filed: Aug. 7, 2006

(65) Prior Publication Data
US 2007/0034868 A1  Feb. 15, 2007

(30) Foreign Application Priority Data
Aug. 12, 2005  (KR)  .................. 10-2005-0074493

(51) Int. Cl.
*G06F 11/00* (2006.01)
(52) U.S. Cl. ........................... 714/744; 714/731
(58) Field of Classification Search ............... 327/161, 327/144, 146; 365/233.11; 714/731, 744, 714/718, 721
See application file for complete search history.

(56) References Cited

U.S. PATENT DOCUMENTS

| | | | | |
|---|---|---|---|---|
| 6,069,508 A | * | 5/2000 | Takai | .................. 327/161 |
| 6,239,631 B1 | * | 5/2001 | Fujioka et al. | .............. 327/144 |
| 6,265,918 B1 | * | 7/2001 | Toda | .......................... 327/146 |
| 6,757,212 B2 | * | 6/2004 | Hamamoto et al. | .... 365/233.11 |
| 2002/0016932 A1 | | 2/2002 | Kushiyama | |
| 2004/0190353 A1 | | 9/2004 | Kim et al. | |
| 2004/0260975 A1 | | 12/2004 | Nagura | |

FOREIGN PATENT DOCUMENTS

| | | |
|---|---|---|
| JP | 11-273342 | 10/1999 |
| KR | 10-1999-0005916 | 1/1999 |
| KR | 10-2002-0043930 | 6/2002 |
| KR | 10-2002-0066478 | 8/2002 |

OTHER PUBLICATIONS

Office Action for corresponding Korean Office Action No. 10-2005-0074493 dated Oct. 23, 2007.

* cited by examiner

*Primary Examiner*—David Ton
(74) *Attorney, Agent, or Firm*—Harness, Dickey & Pierce, P.L.C.

(57) ABSTRACT

A semiconductor device that includes a clock buffer, which generates an internal clock signal in response to a clock signal and a complementary clock signal if the semiconductor device is operating in a first mode and generates the internal clock signal in response to the clock signal and a reference voltage if the semiconductor device is operating in a second mode.

16 Claims, 8 Drawing Sheets

SEMICONDUCTOR DEVICE AND TEST SYSTEM THEREOF

PRIORITY CLAIM

This application claims the benefit of priority to Korean Patent Application No. 2005-74493, filed Aug. 12, 2005, the entire contents of which is incorporated herein by reference.

BACKGROUND OF THE INVENTION

1. Field of the Invention

Example embodiments of the present invention relate to a semiconductor device and, more particularly, to a semiconductor device and a test system thereof in which a timing margin of signals within the semiconductor device may be detected by using a complementary clock signal of the semiconductor device.

2. Description of the Related Art

As semiconductor devices pursue higher integration and higher speed, a timing margin of signals within the semiconductor devices may become smaller. The timing margin of the signals is one of the many factors which affect whether the semiconductor device operates normally and operating speed of the semiconductor device. For example, the semiconductor device may operate abnormally when the timing margin of the signals is short, whereas the operating speed of the semiconductor device may be reduced even though the semiconductor device operates normally if the timing margin of the signals is large.

Based at least in part on the foregoing reason, internal circuits of a semiconductor device may be designed to optimize the timing margin of the signals. However, even though the internal circuits of the semiconductor device may be designed to optimize the timing margin of the signals within the semiconductor device, there may be a case where the timing margin of the signals within the semiconductor device is altered due to process dispersion that may occur during manufacturing of the semiconductor device and/or result from an operating circumstance of the semiconductor device.

However, a conventional semiconductor device and a test device thereof for testing the conventional semiconductor device does not provide a means for detecting the timing margin of the signals within the semiconductor device. The test system of a conventional semiconductor device merely provides the semiconductor device with electric signals according to a test program, and if the semiconductor device operates abnormally in response to the electric signals, the testing device determines the inappropriate timing margin of the signals within the semiconductor device may be one of the reasons for the abnormal operation.

FIG. 1 is a block diagram illustrating a conventional test system.

Referring to FIG. 1, the test system may include a test device 1 and a semiconductor device 2. The test device 1 may provide a semiconductor device 2 with electric signals, for example, clk, clkb, com, add, data, and Vref, in accordance with a test program and may analyze data tdata output from the semiconductor device 2 to determine whether the semiconductor device operates abnormally or not. The semiconductor device 2 may perform a prescribed operation in response to the electric signals clk, clkb, com, add, data, and Vref, which may be provided by the test device 1, and may output the data tdata to the test device 1.

A semiconductor device 2 may include a clock buffer 21 for buffering a clock signal clk and/or a complementary clock signal clkb to generate an internal clock signal, a column address generating circuit 22 for generating an column address CA from an address add in response to a read signal RE or a write signal WR, a column enable circuit 23 for generating a column enable signal CES in response to the read signal RE or the write signal WR and an internal clock signal pclk, a row address generating circuit 24 for generating a row address RA from the address add in response to an active signal ACTIVE, a row enable circuit 25 for generating a row enable signal RES in response to the active signal ACTIVE and the internal clock signal pclk, a column decoder 26 for generating a column selecting signal CSL in response to the column enable signal and the column address CA, a row decoder for generating a word line enable signal NEW in response to the row enable signal RES and the row address RA, a memory cell array 28 for reading or writing data from or to a memory cell in response to the column selecting signal CSL and the word line enable signal NEW, a sense amplifier 29 for detecting and amplifying data outputted from the memory cell array 28 and transmitting data to a data output circuit 211, a data input circuit 210 for inputting data to the memory cell array 28, a data output circuit 211 for outputting data tdata to an external system and/or test device 1, and a command decoder 212 for receiving and decoding a command signal corn to generate control signals RE, WR, ACTIVE, and MRS for controlling an operation of the semiconductor device 2.

The semiconductor device 2 may further include a test control circuit 213, which may be implemented by a mode register set and/or a fuse circuit. The test control circuit 213 may set the semiconductor device 2 to a test mode in response to a mode register set control code MRS provided from the command decoder 212.

As described above, the semiconductor device 2 may perform a prescribed operation in response to electric signals clk, clkb, corn, add, data, and Vref to output data tdata to a test device 1.

During a test mode, if the timing margin of the input signals of internal circuits 21 to 212 of the semiconductor device 2 is appropriate, the internal circuits 21 to 212 normally recognize the input signals and may generate data having information expected by the test device 1, whereas if the timing margin of the input signals of the internal circuits 21 to 212 of the semiconductor device 2 is inappropriate, the internal circuits 21 to 212 do not normally recognize the input signals and may not generate data having information expected by the test device 1.

For example, when a column enable signal CES is first generated and the column address CA is next generated so that the column enable signal CES and the column address CA have an appropriate timing margin, the column decoder 26 recognizes the column address CA and so performs a normal operation to generate the column selecting signals CSL. However, when the column enable signal CES and the column address CA have an inappropriate timing margin, the column decoder does not recognize the column address CA and cannot generate the column selecting signals CSL.

Otherwise, however, the column decoder does not recognize the column address CA, and so the column decoder cannot generate the column selecting signals.

The test device 1 may receive and may analyze the data tdata to confirm that the data tdata having the information expected by the test device 1 is received and thus, may determine that the semiconductor is operating normally and that the timing margin of the signals within the semiconductor device is appropriate. On the other hand, when the data tdata having the information expected by the test device 1 is not received, the test device 1 may determine that the semiconductor is operating abnormally and may determine the inappropriate timing margin of the signals within the semiconductor device may be one of reasons for the abnormal operation.

Accordingly, a conventional test system does not have a means for varying and detecting a timing margin of signals within a semiconductor device 2 and cannot determine a specific reason for the abnormal operation. Even if a conventional test system may determine that an abnormal operation is affected and/or caused by an inappropriate timing margin of signals within the semiconductor device, the test system may not determine which circuit is inaccurate in timing margin and how much of the timing margin inaccurate. In light of the above, time and cost to locate and/or debug a reason for an abnormal operation of a semiconductor device may be unnecessarily increased.

A conventional semiconductor device should secure enough timing margin of the signals to reduce the abnormal operation of the semiconductor device because the conventional semiconductor device cannot detect the optimum timing margin of the signals within the semiconductor device through the test system. In this case, however, even though the semiconductor device may operate normally, there may be a problem because the operating speed of the semiconductor device may be reduced.

SUMMARY OF THE INVENTION

An example embodiment of the present invention provides a semiconductor device. The semiconductor device may include a means for varying the timing margin of the signals within the semiconductor device to detect an optimized timing margin.

An example embodiment of the present invention provides a test system. The test system may vary a timing margin of the signals within the semiconductor device to detect an optimized timing margin.

An example embodiment of the present invention provides a semiconductor device. The semiconductor device may include a clock buffer for generating an internal clock signal in response to a clock signal and a complementary clock signal in a first mode and generating the internal clock signal in response to the clock signal and a reference voltage in a second mode.

An example embodiment of the present invention provides a semiconductor device. The semiconductor device may include a clock buffer for generating an internal clock signal in response to a clock signal and a complementary clock signal in a first mode and generating the internal clock signal in response to the clock signal and a reference voltage in a second mode; first and second circuits for respectively generating first and second signals which have a constant phase and pulse width; a margin control signal generating circuit for generating a margin control signal having a varied phase and pulse width in response to the complementary clock signal and the reference voltage; a margin control circuit for receiving the second signal and the margin control signal and transmitting the second signal in the first mode and transmitting the margin control signal in the second mode; and a third circuit for generating a third signal in response to the first and second signals in the first mode and generating the third signal in response to the first signal and the margin control signal in the second mode.

An example embodiment of the present invention provides a test system. The test system may include a test device for generating a clock signal and a complementary clock signal which have a constant phase and pulse width in the first mode and generating the clock signal having a constant phase and pulse width and the complementary clock signal having a varied phase and pulse width in the second mode; and a semiconductor device for performing an operation according to the internal clock signal which is generated in response to a clock signal and a complementary clock signal in a first mode and performing an operation according to an internal clock signal which is generated in response to the clock signal and a reference voltage in a second mode, and varying a timing margin of internal signals according to a margin control signal which is generated in response to the complementary clock signal and the reference voltage in a second mode.

A semiconductor device according to an example embodiment of the present invention may include a clock buffer for generating an internal clock signal in response to the clock signal and the complementary clock signal in the first mode and generating the internal clock signal in response to the clock signal and a reference voltage in the second mode; first and second circuits for respectively generating first and second signals which have a constant phase and pulse width; a margin control signal generating circuit for generating a margin control signal having a varied phase and pulse width in response to the complementary clock signal and the reference voltage; a margin control circuit for receiving the second signal and the margin control signal, and transmitting the second signal in the first mode and transmitting the margin control signal in the second mode; and a third circuit for generating a third signal in response to the first and second signals in the first mode and generating the third signal in response to the first signal and the margin control signal in the second mode.

BRIEF DESCRIPTION OF THE DRAWINGS

Example embodiments of the present invention will be more clearly understood from the detailed description of example embodiments of the present invention taken in conjunction with the accompanying drawings, in which.

DETAILED DESCRIPTION OF THE INVENTION

Figure 1:
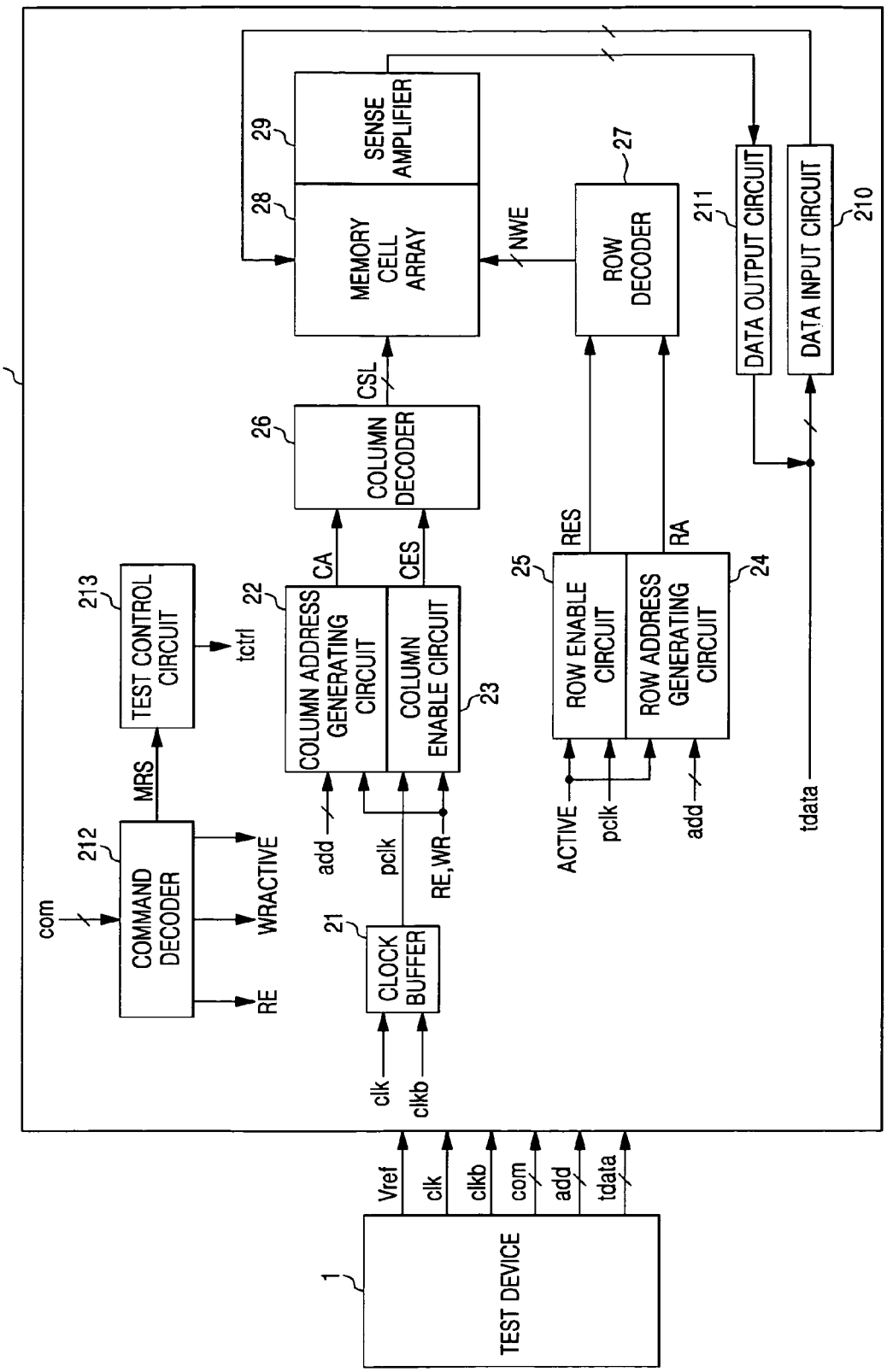
FIG. 1 is a block diagram illustrating a conventional test system.

Various example embodiments of the present invention will now be described more fully with reference to the accompanying drawings in which some example embodiments of the invention are shown. In the drawings, the relative sizes of various components may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Now, in order to more specifically describe example embodiments of the present invention, various embodiments of the present invention will be described in detail with reference to the attached drawings. However, the present invention is not limited to the example embodiments, but may be embodied in various forms.

Although example embodiments of the present invention are disclosed for illustrative purposes, those skilled in the art will appreciate that various modifications, additions and substitutions are possible, without departing from the scope and spirit of the invention as disclosed in the accompanying claims.

Figure 2:
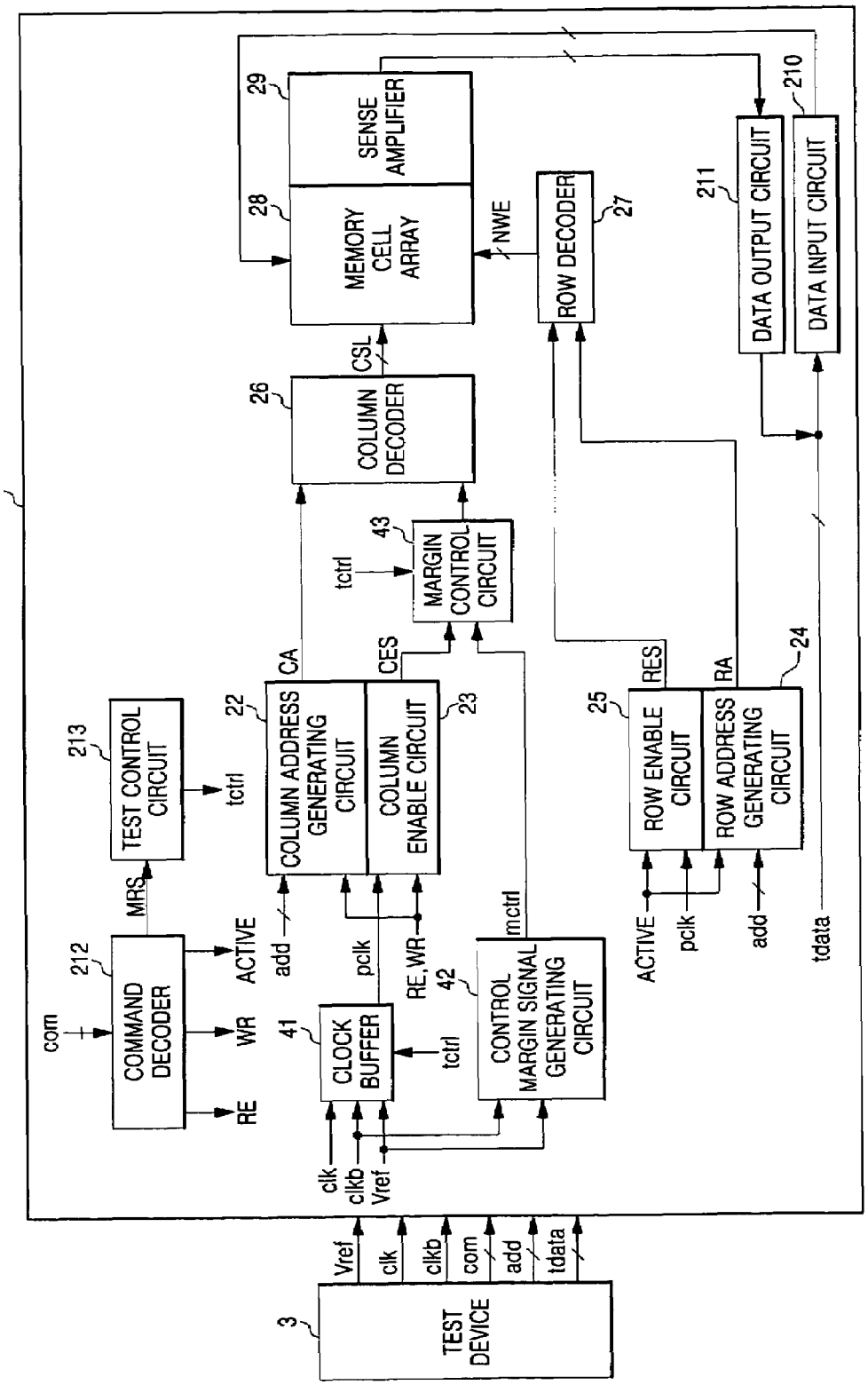
FIG. 2 is a block diagram illustrating a test system according to an example embodiment of the present invention.

FIG. 2 is a block diagram illustrating a test system according to an example embodiment of the present invention.

Referring to FIG. 2, a test system may include a test device 3 and a semiconductor device 4. The semiconductor device 4 may include a clock buffer 21, a column address generating circuit 22, a column enable circuit 23, a row address generating circuit 24, a row enable circuit 25, a column decoder 26, a row decoder 27, a memory cell array 28, a sense amplifier 29, a data input circuit 210, a data output circuit 211, a command decoder 212, and a test control circuit 213. According to an example embodiment of the present invention, a semiconductor device 4 may further include a clock buffer 41. The clock buffer 41, as shown in FIG. 2 may be substituted for the clock buffer 21 of FIG. 1. According to an example embodiment of the present invention, a semiconductor device may also include a margin control signal generating circuit 42 and a margin control circuit 43.

Like reference numerals in FIGS. 1 and 2 denote like parts and perform like operations, and thus description on those like parts will be omitted herein for the sake of brevity.

When operating in a normal mode, the test device 3 may provide the semiconductor device 4 with electric signals clk, clkb, com, add, data, and Vref. For example, the electrical signals may include a clock signal clk and a complementary clock signal clkb, which may have a constant phase and pulse width. The test device 3 may analyze signals outputted from the semiconductor device 4 to check whether function and/or performance of the semiconductor device 4 are substantially identical to those designed or not.

According to an example embodiment of the present invention, a test device 3 may have a timing margin detecting mode for detecting a timing margin of signals within a semiconductor device 4. According to an example embodiment of the present invention, a timing margin detecting mode may be designed for detecting an optimum timing margin of signals within a semiconductor device 4. In a timing margin detecting mode, a test device 3 may provide electric signals clk, com, add, data, and Vref for normally operating a semiconductor device 4, and at substantially the same time may vary and provide a phase and pulse width of a complementary clock signal clkb while analyzing signals outputted from the semiconductor device 4 to detect an optimum timing margin of the signals within the semiconductor device 4 according to an example embodiment of the present invention.

A clock buffer 41 according to an example embodiment of the present invention may receive the clock signal clk, the complementary clock signal clkb and a reference voltage Vref from the test device 3, and may buffer the clock signal clk and the complementary clock signal clkb to generate an internal clock signal pclk in a normal mode and may compare the clock signal to the reference voltage Vref to generate the internal clock signal pclk in a timing margin detecting mode.

According to an example embodiment of the present invention, the clock signal clk and the complementary clock signal clkb may have a voltage value of "reference voltage Vref +$\alpha$(integer)" in a high level and may have a voltage value of "reference voltage Vref −$\alpha$(integer)" in a low level. Thus, the internal clock signal pclk generated by the clock buffer 41 buffering the clock signal clk and the complementary clock signal clkb may be substantially equal to the internal clock signal pclk generated by the clock buffer 41 comparing the clock signal clk to the reference voltage Vref.

According to an example embodiment of the present invention, a margin control signal generating circuit 42 may receive and compare the reference voltage Vref and the complementary clock signal clkb which may have a constant phase and pulse width in the normal mode and a varied phase and pulse width in the timing margin detecting mode. The margin control signal generating circuit 42 may generate a margin control signal mctrl. For example, the margin control signal generating circuit 42 may generate a margin control signal mctrl having a constant phase and pulse width according to the complementary clock signal clkb having a constant phase and pulse width in the normal mode and a margin control signal mctrl having a varied phase and pulse width according to the complementary clock signal clkb having a phase and pulse width in the timing margin detecting mode.

According to an example embodiment of the present invention, a margin control circuit 43 may be implemented by a switching element, such as, for example, a multiplexer MUX, and may receive the column enable signal CES and the margin control signal mctrl and may transmit the column enable signal CES to a column decoder 26 in the normal mode and may transmit the margin control signal mctrl to the column decoder 26 in the timing margin detecting mode. For example, when the semiconductor device 4 operates in the timing margin detecting mode, the margin control circuit 43 transmits to the column decoder 26 the margin control signal mctrl having a varied phase and pulse width instead of the column enable signal CES having a constant phase and pulse width to vary a timing margin of input signals of the column decoder 26 as it pleases.

An operation of the test system of an example of the present invention, as shown in FIG. 2, is explained below.

First, an example operation of a test system in the normal mode is described.

According to an example embodiment of the present invention, a test device 3 may generate a clock signal clk and a complementary clock signal clkb which may have a constant phase and pulse width, command signals having information which may cause a semiconductor device 4 to operate in the normal mode, and a reference voltage Vref having a voltage level. The test device 3 may apply the above-described signals produced when operating in the normal mode to the semiconductor device 4.

A command decoder 212 of the semiconductor device 4 may generate a mode register set control signal MRS for the normal mode operation, and a test control circuit 213 may disable a test control signal tctrl. A clock buffer 41 may buffer the clock signal clk and the complementary clock signal clkb to generate the internal clock signal pclk, and a margin control signal generating circuit 42 may generate a margin control signal mctrl having a constant phase and pulse width according to the complementary clock signal clkb having a constant phase and pulse width.

In the normal mode, when the test device 3 generates and outputs the command signals corn and an address add for a read operation, the command decoder 212 of the semiconductor device 4 may enable a read signal RE.

A column address generating circuit 22 may generate a column address CA having a constant phase and pulse width, the column enable circuit 23 may generate a column enable signal CES having a constant phase and pulse width, and the margin control circuit 43 may select and output the column enable signal CES having a constant phase and pulse width in response to the test control signal tctrl.

A column decoder 26 may receive the column address CA and the column enable signal CES which have a constant timing margin therebetween and may generate a column selecting signal CSL. In the normal mode, because the column address CA and the column enable signal CES have a constant phase and pulse width, the timing margin between the column address CA and the column enable signal CES, which may be inputted to the column decoder 26, is constant.

A memory cell array 28 may obtain data stored in a memory cell corresponding to the column selecting signal CSL and may output the data to the test device 3 through the data output circuit 211, and the test device 3 may receive and analyze the data tdata outputted from the semiconductor device 4 to check function and/or performance of the semiconductor device 4.

An example operation of the test system in the timing margin detecting mode is described below.

A test device 3 may generate a clock signal clk having a constant phase and pulse width, the complementary clock signal clkb having a varied phase and pulse width, the command signals having information which causes the semiconductor device 4 to operate in the timing margin detecting mode, and the reference voltage Vref having a voltage level. The test device 3 may apply the above-described signals produced when operating in the time margin detecting mode to the semiconductor device 4.

A command decoder 212 of a semiconductor device 4 may generate the mode register set control signal MRS for the timing margin detecting mode operation, and a test control circuit 213 may enable a test control signal tctrl. A clock buffer 41 may buffer the clock signal clk and the reference voltage Vref to generate an internal clock signal pclk, and a margin control signal generating circuit 42 may generate a margin control signal mctrl having a varied phase and pulse width according to the complementary clock signal clkb having a varied phase and pulse width.

In the time margin detecting mode, when the test device 3 generates and command signals corn and an address add for a read operation, the command decoder 212 of the semiconductor device 4 may enable a read signal RE.

A column address generating circuit 22 may generate a column address CA having a constant phase and pulse width, the column enable circuit 23 may generate a column enable signal CES having a constant phase and pulse width, and the margin control circuit 43 may select and output the margin control signal mctrl having a varied phase and pulse width in response to the test control signal tctrl.

A column decoder 26 may receive the column address CA and the margin control signal mctrl which may have a varied timing margin therebetween and may generate a column selecting signal CSL. In the time margin detecting mode, because the column address CA has a constant phase and pulse width but the margin control signal mctrl has a varied phase and pulse width, the timing margin between the column address CA and the margin control signal mctrl which may be inputted to the column decoder 26 is varied according to a variation amount of the phase and pulse width of the margin control signal mctrl.

A memory cell array 28 may obtain data stored in a memory cell corresponding to the column selecting signal CSL and may output the data to the test device 3 through a data output circuit 211, and the test device 3 may receive and analyze the data tdata outputted from the semiconductor device 4 to check whether or not the semiconductor device is operating normally. According to an example embodiment of the present invention, the timing margin between the input signals of the column decoder 26 may be determined as appropriate when it is determined that the semiconductor device is operating normally, whereas the timing margin between the input signals of the column decoder 26 may be determined as inappropriate when it is determined that the semiconductor device is operating abnormally.

The test device 3 may repetitively perform the testing procedure while varying the phase and pulse width of the complementary clock signal clkb until a timing margin of the input signals for the column decoder 26 to operate normally is detected. According to an example embodiment of the present invention, an optimum timing margin may be found by performing the testing procedure Accordingly, a test system of an example of the present invention as shown in FIG. 2 may detect a timing margin of the input signals of the column decoder 26 by varying the timing margin of the input signals of the column decoder 26. Also, the test device 3 may vary the timing margin of the signals within the semiconductor device by using a complementary clock signal clkb without generating a discrete control signal.

Figure 3A:
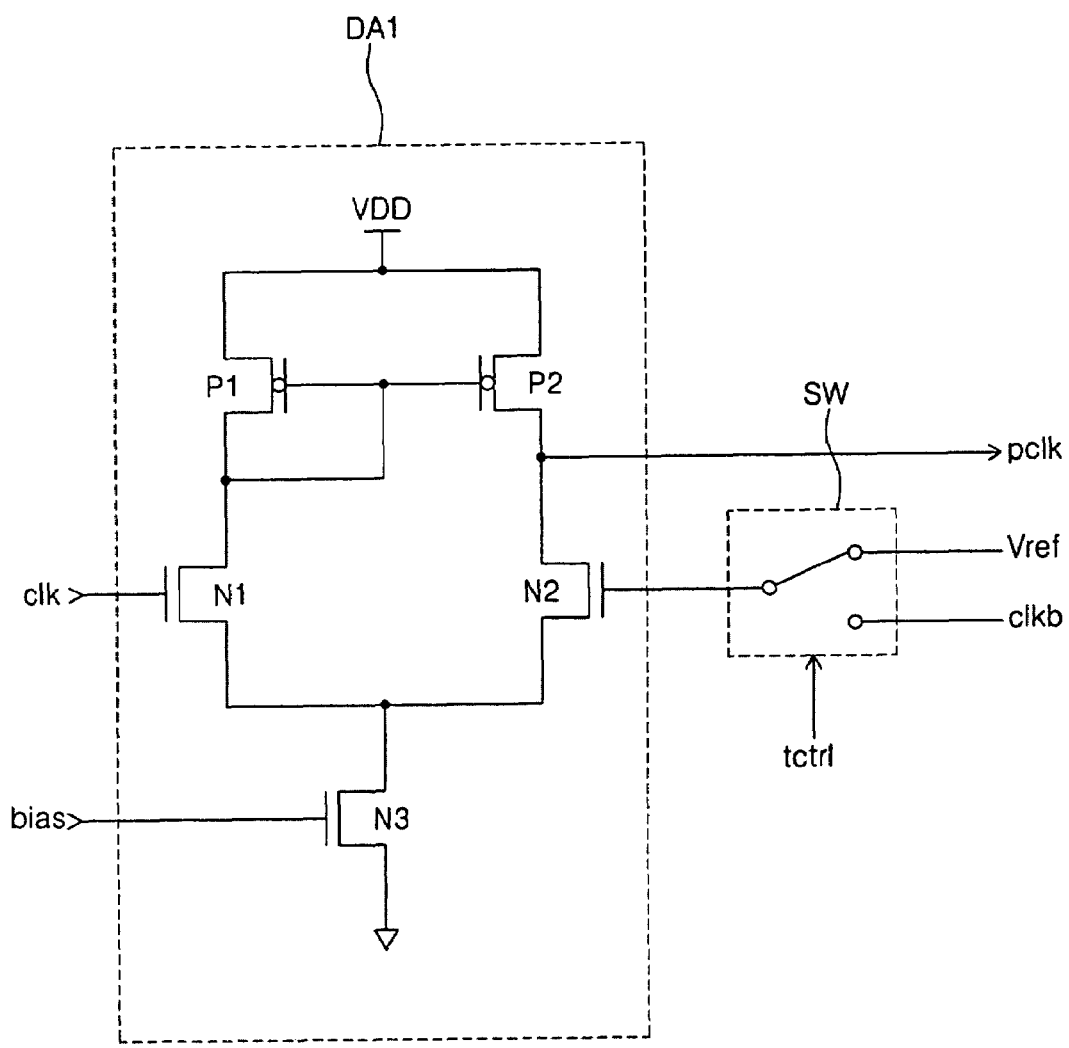
FIG. 3*a* is a circuit diagram illustrating a clock buffer according to an example embodiment of the present invention.

FIG. 3a is a circuit diagram illustrating a clock buffer according to an example embodiment of the present invention.

Referring to FIG. 3a, a clock buffer 41 may include a switch SW and a comparator DA1. The switch SW may select one of a complementary clock signal clkb and a reference voltage Vref in response to a test control signal ctrl and may transmit the selected signal to a differential amplifier DA1. The comparator DA1 may be implemented by a differential amplifier which may include a plurality of PMOS transistors P1 and P2 and/or a plurality of NMOS transistors N1 to N3, and may compare the output signal clkb or reference voltage Vref provided by the switch SW to generate an internal clock signal pclk.

Figure 3B:
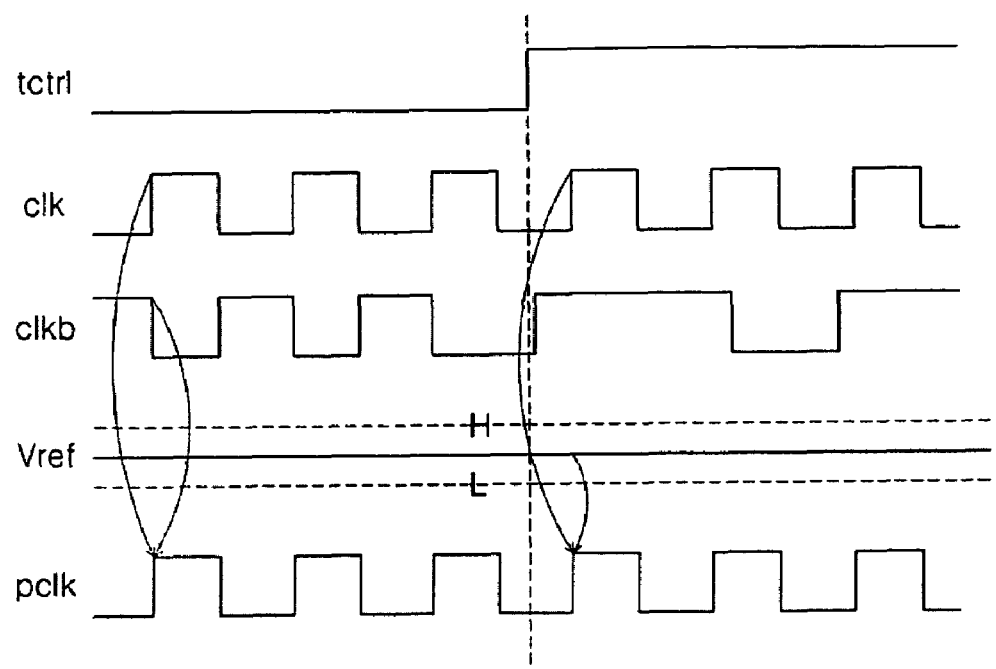
FIG. 3*b* is a timing diagram illustrating an operation of a clock buffer according to an example of the present invention.

FIG. 3b is a timing diagram illustrating an operation of the clock buffer of an example of the present invention as shown in FIG. 3a. The operation of the clock buffer will be explained below with reference to FIGS. 3a and 3b.

A clock buffer according to an example of the present invention as shown in FIG. 3a may receive a reference voltage Vref having a voltage level, a clock signal clk having a phase and pulse width which may be constant regardless of the operating mode, and a complementary clock signal clkb which may have a constant phase and pulse width in the normal mode and a varied phase and pulse width in the timing margin detecting mode from the test device 3. The clock buffer may also receive a test control signal tctrl which may have a low level in the normal mode and a high level in the timing margin detecting mode from the test control signal 213.

For example, in the normal mode, the switch SW becomes a first state in response to the test control signal tctrl having a low level to transmit the complementary clock signal clkb to the comparator DA1. The comparator DA1 receives and compares the clock signal clk and the complementary clock signal clkb which have an opposite phase to each other but the same pulse width to generate the internal clock signal pclkb having the same phase and pulse width as the clock signal clk.

On the other hand, for example, in the timing margin detecting mode, the switch SW becomes a second state in response to the test control signal tctrl having a high level to transmit the reference voltage Vref to the comparator DA1. The comparator DA1 receives and compares the clock signal clk having the same phase and pulse width as in the normal mode and the reference voltage Vref to generate the internal clock signal pclk having the same phase and pulse width as the clock signal clk.

Accordingly, in an example of the present invention as shown in of FIG. 3a, the clock buffer may require the complementary clock signal clkb in the normal mode but may not require the complementary clock signal clkb in the timing margin detecting mode.

Thus, a clock buffer according to an example embodiment of the present invention as shown in FIG. 3a may cause the timing margin of the signals within the semiconductor device to vary by using the complementary clock signal clkb even though the test device 3 does not generate a discrete control signal.

Figure 4A:
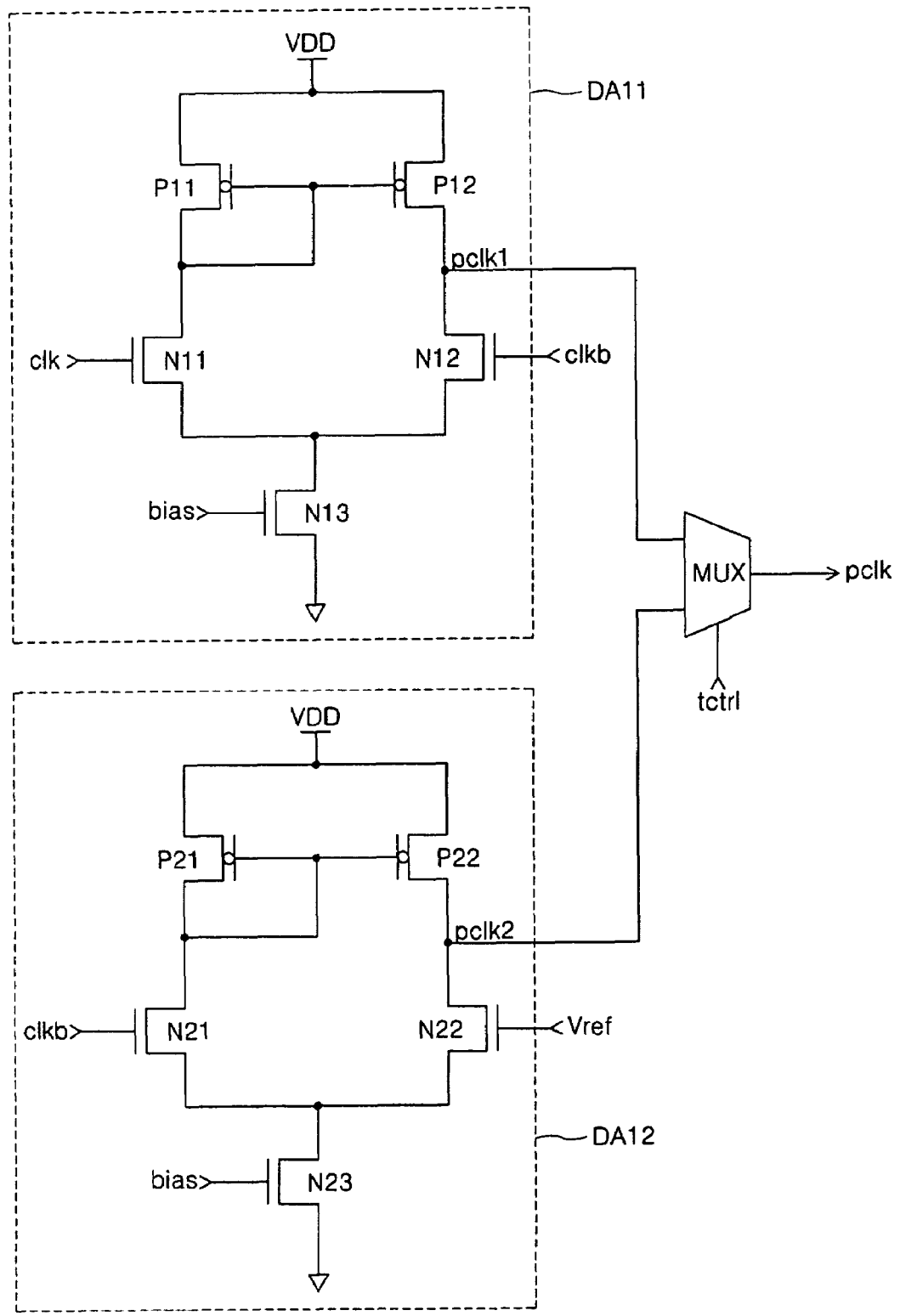
FIG. 4*a* is a circuit diagram illustrating a clock buffer according to an example embodiment of the present invention.

FIG. 4a is a circuit diagram illustrating a clock buffer according to an example embodiment of the present invention.

Referring to FIG. 4a, a clock buffer 41 may include first and second comparators DA11 and DA12 and a multiplexer MUX. The first comparator DA11 may be implemented by a differential amplifier which may include a plurality of PMOS transistors P11 and P12 and/or a plurality of NMOS transistors N11 to N13 and may compare a clock signal clk and a complementary clock signal clkb to generate a first internal clock signal pclk1. The second comparator DA12 may be implemented by a differential amplifier which may include a plurality of PMOS transistors P21 and P22 and/or a plurality of NMOS transistors N21 to N23 and may compare the clock signal clk and a reference voltage Vref to generate a second internal clock signal pclk2. The multiplexer MUX may select and output one of the first and second internal clock signals pclk1 and pclk2 under control of a test control signal tctrl.

Figure 4B:
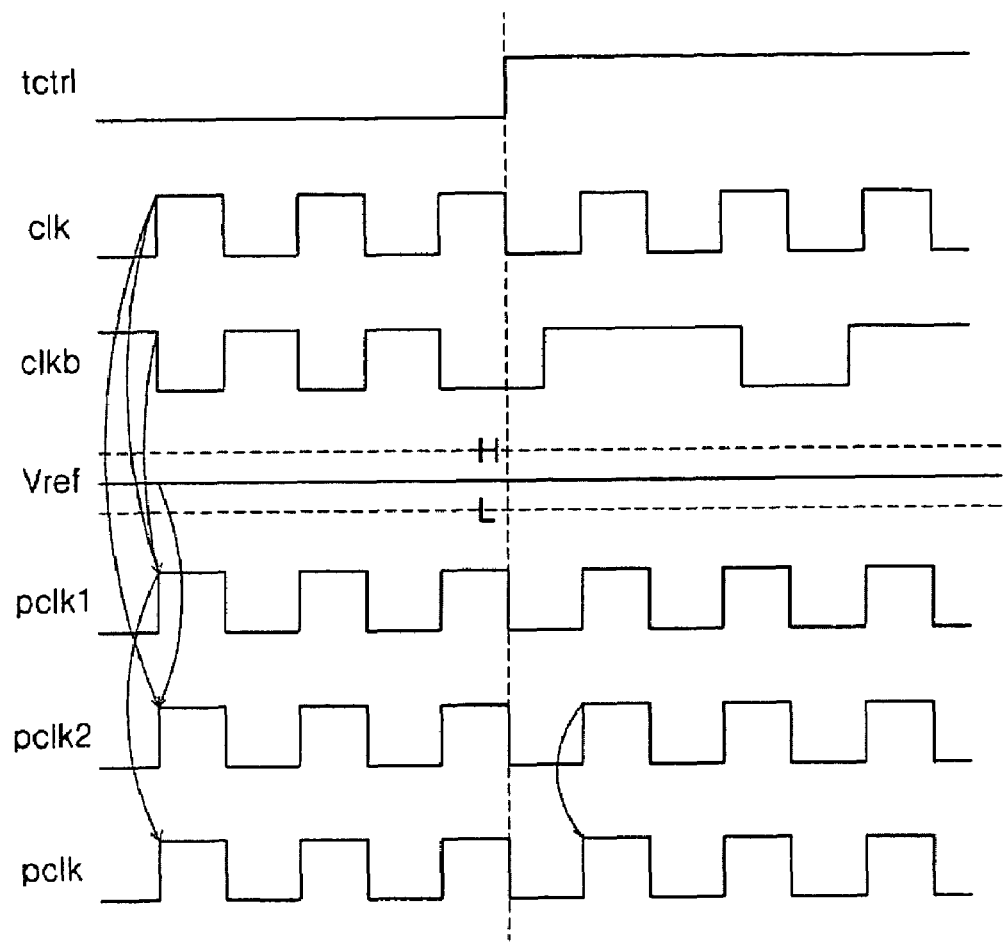
FIG. 4*b* is a timing diagram illustrating an operation of the clock buffer according to an example of the present invention.

FIG. 4b is a timing diagram illustrating an operation of a clock buffer of according to an example of the present invention as shown in FIG. 4a. An example operation of a margin control signal generating circuit will be explained below with reference to FIGS. 4a and 4b.

The clock buffer shown in FIG. 4a may receive a reference voltage Vref having a voltage level, a clock signal clk having a phase and pulse width which may be constant regardless of an operating mode, and a complementary clock signal clkb which may have a constant phase and pulse width in a normal mode and a varied phase and pulse width in a timing margin detecting mode from the test device 3. The clock buffer may also receive the test control signal tctrl which may have a low level in the normal mode and a high level in the timing margin detecting mode from the test control signal 213.

Regardless of the operating mode, a comparator DA11 may receive and compare the clock signal clk and the complementary clock signal clkb to generate a first internal clock signal pclk1, and the comparator DA11 may receive and compare the clock signal clk and the reference voltage Vref to generate a second internal clock signal pclk2.

A multiplexer MUX may receive the first and second internal clock signals pclk1 and pclk2 and may select and output the first internal clock signal pclk1 when the test control signal tctrl has a low level and may select and output the second internal clock signal pclk2 when the test control signal tctrl has a high level.

For example, the multiplexer MUX may output the first internal clock signal pclk1 generated by using the clock signal clk and the complementary clock signal clkb as the internal clock signal pclk in the normal mode, and may output the second internal clock signal pclk2 generated by using the clock signal clk and the reference voltage Vref as the internal clock signal pclk in the timing margin detecting mode.

Accordingly, the clock buffer of an example of the present invention as shown in FIG. 4a may require the complementary clock signal clkb in the normal mode but may not require the complementary clock signal clkb in the timing margin detecting mode.

Thus, according to an example embodiment of the present invention, the clock buffer of FIG. 4a may cause the timing margin of the signals within the semiconductor device to vary by using the complementary clock signal clkb even though the test device 3 does not generate a discrete control signal.

Figure 5A:
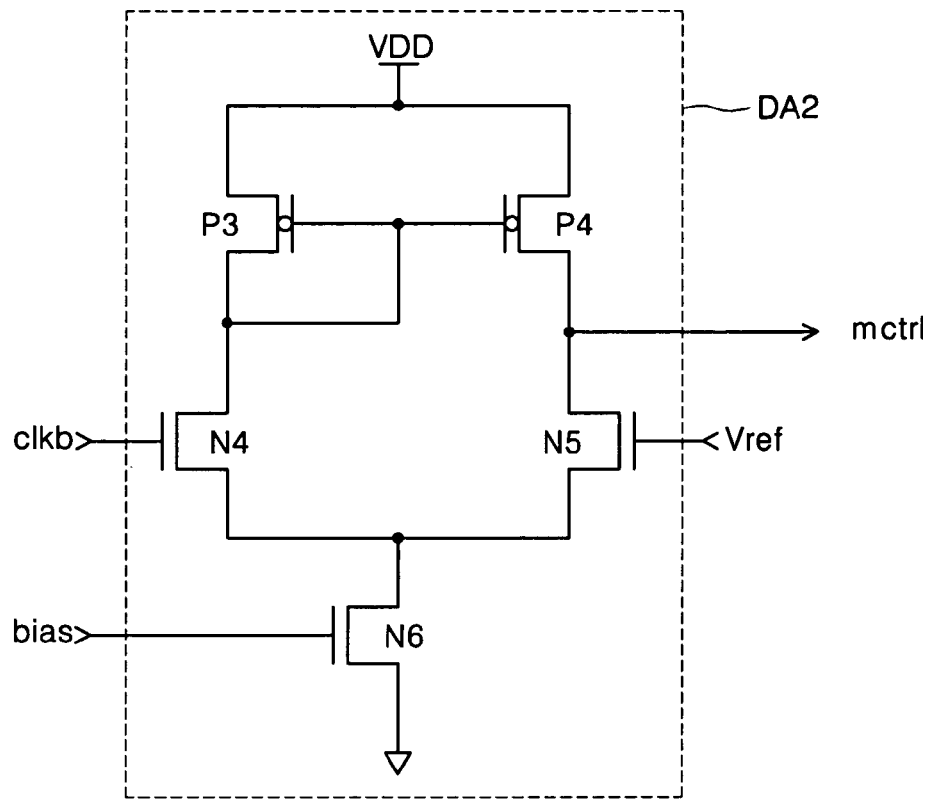
FIG. 5*a* is a circuit diagram illustrating a margin control signal generating circuit according to an example embodiment of the present invention.

FIG. 5a is a circuit diagram illustrating a margin control signal generating circuit according to an example embodiment of the present invention.

Referring to FIG. 5a, a margin control signal generating circuit 42 may be a comparator DA2 which may be implemented by a differential amplifier which may include a plurality of PMOS transistors P3 and P4 and/or a plurality of NMOS transistors N4 to N6, and may compare a reference voltage Vref and a complementary clock signal clkb to generate a margin control signal mctrl.

Figure 5B:
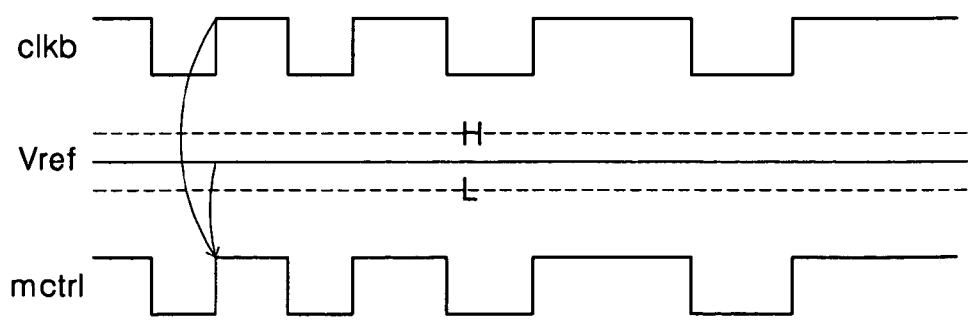
FIG. 5*b* is a timing diagram illustrating an operation of the margin control signal generating circuit according to an example of the present invention.

FIG. 5b is an example timing diagram illustrating an operation of the margin control signal generating circuit of FIG. 5a. An example operation of the margin control signal generating circuit will be explained below with reference to FIGS. 5a and 5b.

The margin control signal generating circuit of FIG. 5a may receive the reference voltage Vref, which may have a voltage level and the complementary clock signal clkb which may have a constant phase and pulse width in a normal mode and a varied phase and pulse width in a timing margin detecting mode from the test device 3.

In the normal mode, for example, the comparator DA2 receives and compares the complementary clock signal clkb, which has a constant phase and pulse width, and the reference voltage Vref to generate the margin control signal mctrl having a constant phase and pulse width like the complementary clock signal clkb.

On the other hand, for example, in the timing margin detecting mode, the comparator DA2 receives and compares the complementary clock signal clkb, which has a varied phase and pulse width, and the reference voltage Vref having a voltage level to generate the margin control signal mctrl having a varied phase and pulse width like the complementary clock signal clkb.

As described above, in the timing margin detecting mode, the margin control signal generating circuit 42 may receive the complementary clock signal clkb having a varied phase and pulse width from the test device 3 to generate the margin control signal mctrl, which may have a varied phase and pulse width.

According to an example embodiment of the present invention, the semiconductor device 4 may be designed to control whether to supply a bias voltage of the margin control signal generating circuit according to the operating mode to prevent unnecessary power consumption in advance. Stated differently, a semiconductor device may be designed to supply the bias voltage to the comparator DA2 only when the semiconductor device operates in the timing margin detecting mode.

Figure 6:
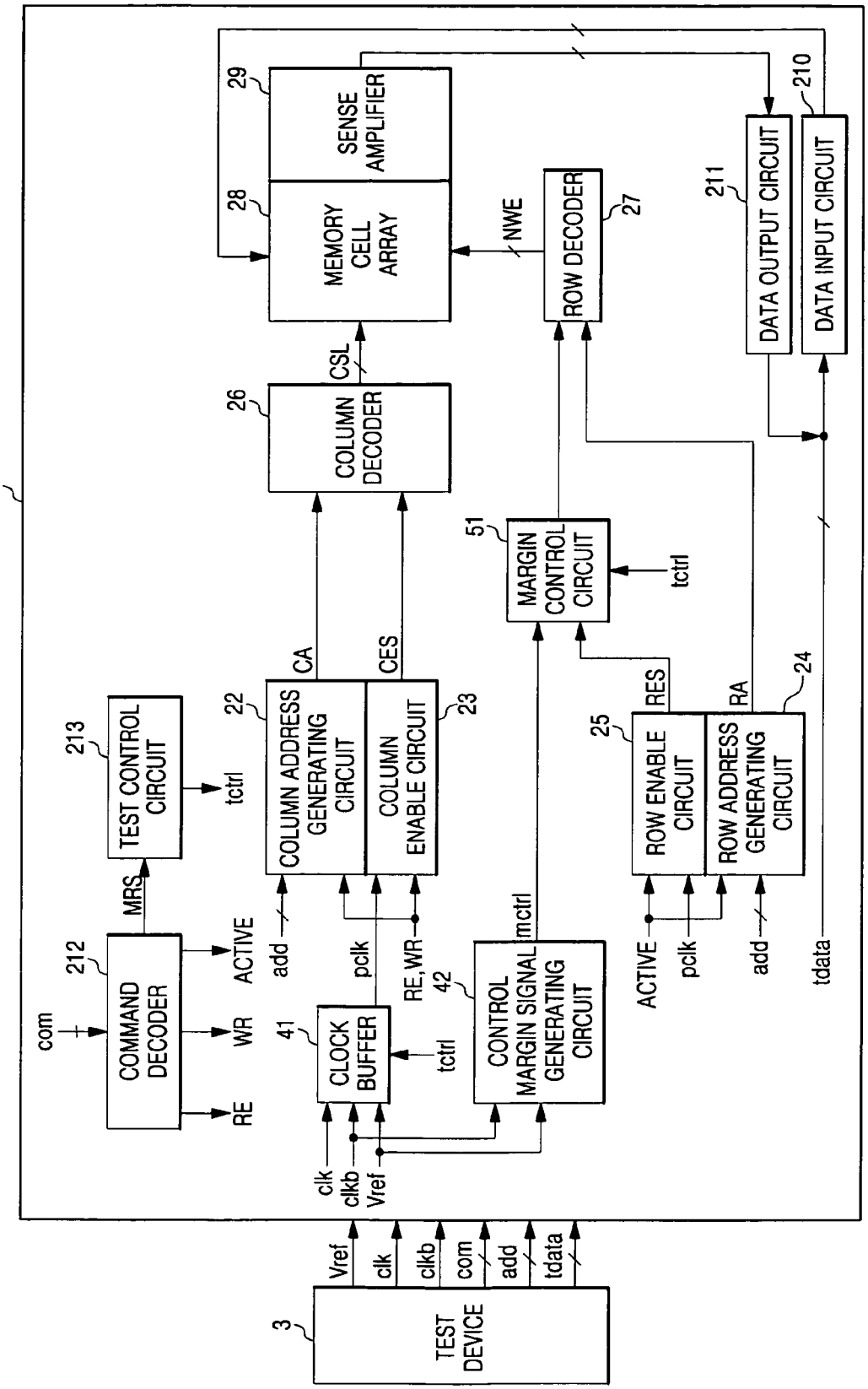
FIG. 6 is a block diagram illustrating a test system according to an example embodiment of the present invention.

FIG. 6 is a block diagram illustrating a test system according to an example embodiment of the present invention.

Referring to FIG. 6, a test system according to an example embodiment of the present invention may include a test device 3 and a semiconductor device 5. The semiconductor device 5 may include a clock buffer 41, a column address generating circuit 22, a column enable circuit 23, a row address generating circuit 24, a row enable circuit 25, a column decoder 26, a row decoder 27, a memory cell array 28, a sense amplifier 29, a data input circuit 210, a data output circuit 211, a command decoder 212, a test control circuit 213, and a margin control signal generating circuit 42. According to an example embodiment of the present invention, the semiconductor device 5 may also include a margin control circuit 51 connected to the row decoder 27. The margin control circuit 51 may be substituted for the margin control circuit 43 of FIG. 2 connected to the column decoder 26.

Like reference numerals of FIGS. 2 and 6 denote like parts and perform like operations, and thus description on the like parts will be omitted herein for the sake of brevity.

The margin control circuit 51 may be implemented by a switching element, for example, a multiplexer MUX, and may receive a row enable signal RES and a margin control signal mctrl and may transmit the row enable signal RES to the row decoder 27 in the normal mode and may transmit the margin control signal mctrl to the row decoder 27 in the timing margin detecting mode.

The margin control circuit 51 may transmit the margin control signal mctrl having a varied phase and pulse width instead of the row enable signal RES having a constant phase and pulse width, and thus, may vary the timing margin of the input signals of the row decoder 27 as it pleases by the same principle as described above, with respect to an example of the present invention as shown in FIG. 2, when the semiconductor device 5 operates in the timing margin detecting mode.

Stated differently, the test system of an example of the present invention as shown in FIG. 6 may vary the timing margin of the input signals of the row decoder 27 to detect a timing margin of the input signals of the row decoder 27. The test system may detect an optimized timing margin of the input signals of the row decoder 27.

As described above with respect to example embodiments of the present invention, a margin control signal generating circuit and a margin control circuit may be arranged on a path of transmitting the input signals of the column decoder and/or the row decoder to vary the timing margin of the input signals of the column decoder and/or the row decoder. However, it should be understood that the margin control signal generating circuit and the margin control circuit may be arranged on a path of transmitting the input signals of a circuit having at least two input signals (e.g., sense amplifier, data input circuit or data output circuit) to vary the timing margin of the input signals thereof.

As described above, the semiconductor device and the test system thereof according to an example embodiment of the present invention may detect the optimized timing margin of the signals within the semiconductor device by varying the timing margin of the signals using a complementary clock signal. Thus, it may be possible to determine how much the timing margin is short or surplus, for example, thereby significantly reducing time and cost associated with locating and/or debugging a reason for an abnormal operation of a semiconductor device and reducing and/or preventing the operating speed from being unnecessarily reduced due to the timing margin in advance.

A test system according to an example embodiment of the present invention may vary the timing margin of the signals within the semiconductor device using a complementary clock signal without generating an additional control signal and thus may not need to generate the additional control signal. Thus, according to an example embodiment of the present invention, it is possible to detect a timing margin of the signals within the semiconductor device using a complementary clock signal while normally operating the semiconductor device.

What is claimed is:

1. A semiconductor device, comprising:
    a clock buffer for generating an internal clock signal in response to a clock signal and a complementary clock signal in a first mode and generating the internal clock signal in response to the clock signal and a reference voltage in a second mode;
    first and second circuits for respectively generating first and second signals which have a constant phase and pulse width;
    a margin control signal generating circuit for generating a margin control signal having a varied phase and pulse width in response to the complementary clock signal and the reference voltage;
    a margin control circuit for receiving the second signal and the margin control signal, and transmitting the second signal in the first mode and transmitting the margin control signal in the second mode; and a third circuit for generating a third signal in response to the first and second signals in the first mode and generating the third signal in response to the first signal and the margin control signal in the second mode.

2. The device of claim 1, wherein the clock signal and the complementary clock signal, which have a constant phase and pulse width, are received in the first mode, and the clock signal having a constant phase and pulse signal and the complementary clock signal having a varied phase and pulse width are received in the second mode.

3. The device of claim 1, wherein a first level of the clock signal and the complementary signal has a voltage value of "reference voltage +α(integer)", and a second level of the clock signal and the complementary signal has a voltage value of "reference voltage −α(integer)".

4. The device of claim 1, wherein the clock buffer includes
a switch for receiving the complementary clock signal and the reference voltage, and transmitting the complementary clock signal in the first mode and transmitting the reference voltage in the second mode; and
a comparator for comparing an output signal of the switch and the clock signal to generate the internal clock signal.

5. The device of claim 1, wherein the clock buffer includes
a first comparator for comparing the clock signal and the complementary clock signal to generate a first internal clock signal;
a second comparator for comparing the clock signal and the reference voltage to generate a second internal clock signal; and
a switch for transmitting the first internal clock signal as the internal clock signal in the first mode and transmitting the second internal clock signal as the internal clock signal in the second mode.

6. The device of claim 5, wherein the switch is a multiplexer.

7. The device of claim 1, wherein the margin control signal generating circuit is a comparator for comparing the complementary clock signal and the reference voltage to generate the margin control signal.

8. The device of claim 1, wherein the margin control circuit is a multiplexer which receives the second signal and the margin control signal, and transmits the second signal in the first mode and transmits the margin control signal in the second mode.

9. A test system, comprising:
a test device for generating a clock signal and a complementary clock signal which have a constant phase and pulse width in a first mode and generating the clock signal having a constant phase and pulse width and the complementary clock signal having a varied phase and pulse width in a second mode; and
a semiconductor device for performing an operation according to an internal clock signal which is generated in response to the clock signal and the complementary clock signal in the first mode and performing an operation according to the internal clock signal which is generated in response to the clock signal and a reference voltage in the second mode, and varying a timing margin of internal signals according to a margin control signal which is generated in response to the complementary clock signal and the reference voltage in a second mode.

10. The system of claim 9, wherein the semiconductor device includes
a clock buffer for generating the internal clock signal in response to the clock signal and the complementary clock signal in the first mode and generating the internal clock signal in response to the clock signal and the reference voltage in the second mode;
first and second circuits for respectively generating first and second signals which have a constant phase and pulse width;
a margin control signal generating circuit for generating the margin control signal having a varied phase and pulse width in response to the complementary clock signal and the reference voltage;
a margin control circuit for receiving the second signal and the margin control signal, and transmitting the second signal in the first mode and transmitting the margin control signal in the second mode; and
a third circuit for generating a third signal in response to the first and second signals in the first mode and generating the third signal in response to the first signal and the margin control signal in the second mode.

11. The system of claim 9, wherein a first level of the clock signal and the complementary signal has a voltage value of "reference voltage +α(integer)", and a second level of the clock signal and the complementary signal has a voltage value of "reference voltage −α(integer)".

12. The system of claim 9, wherein the clock buffer includes
a switch for receiving the complementary clock signal and the reference voltage, and transmitting the complementary clock signal in the first mode and transmitting the reference voltage in the second mode; and
a comparator for comparing an output signal of the switch and the clock signal to generate the internal clock signal.

13. The system of claim 9, wherein the clock buffer includes
a first comparator for comparing the clock signal and the complementary clock signal to generate a first internal clock signal;
a second comparator for comparing the clock signal and the reference voltage to generate a second internal clock signal; and
a switch for transmitting the first internal clock signal as the internal clock signal in the first mode and transmitting the second internal clock signal as the internal clock signal in the second mode.

14. The system of claim 13, wherein the switch is a multiplexer.

15. The system of claim 9, wherein the margin control signal generating circuit is a comparator for comparing the complementary clock signal and the reference voltage to generate the margin control signal.

16. The system of claim 9, wherein the margin control circuit is a multiplexer which receives the second signal and the margin control signal, and transmits the second signal in the first mode and transmits the margin control signal in the second mode.

* * * * *